(12) United States Patent
Weigl et al.

(10) Patent No.: US 11,099,308 B2
(45) Date of Patent: Aug. 24, 2021

(54) REFLECTIVE OPTICAL ELEMENT

(71) Applicant: Carl Zeiss SMT GmbH, Oberkochen (DE)

(72) Inventors: Frank Weigl, Holzheim (DE); Konstantin Forcht, Aalen (DE); Horst Feldermann, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 355 days.

(21) Appl. No.: 15/940,006

(22) Filed: Mar. 29, 2018

(65) Prior Publication Data

US 2018/0224586 A1  Aug. 9, 2018

Related U.S. Application Data

(63) Continuation of application No. PCT/EP2016/072246, filed on Sep. 20, 2016.

(30) Foreign Application Priority Data

Sep. 29, 2015  (DE) .......................... 102015218763.2

(51) Int. Cl.
*G02B 5/20* (2006.01)
*G02B 5/08* (2006.01)
(Continued)

(52) U.S. Cl.
CPC ......... *G02B 5/0891* (2013.01); *G02B 5/0858* (2013.01); *G02B 21/16* (2013.01); *G03F 7/7015* (2013.01); *G21K 1/062* (2013.01)

(58) Field of Classification Search
CPC .... G02B 5/0858; G02B 5/0891; G02B 21/16; G02B 5/08; G02B 5/0808; G02B 5/0825;
(Continued)

(56) References Cited

U.S. PATENT DOCUMENTS 3,649,359 A * 3/1972 Apfel et al. ........... G02B 5/285
  359/587
4,009,453 A * 2/1977 Mahlein ................. G02B 5/288
  372/99
(Continued)

FOREIGN PATENT DOCUMENTS

DE  102012221186 A1  10/2013
EP      1152263 A1  11/2001
(Continued)

OTHER PUBLICATIONS

Japanese Office Action with English translation in JP Application No. 2018-514390, dated Jun. 3, 2019, 7 pages.
(Continued)

*Primary Examiner* — Thong Q Nguyen
(74) *Attorney, Agent, or Firm* — Edell, Shapiro & Finnan, LLC

(57) ABSTRACT

A reflective optical element, in particular for a DUV or VUV operating wavelength range, includes a substrate, a dielectric layer system and a metallic coating between the substrate and the dielectric layer system. The dielectric layer system (26) includes a layer (L) of material having a lower refractive index n1 at the operating wavelength, a layer (H) of material having a higher refractive index n2 at the operating wavelength and a layer (M) of material having a refractive index n3 at the operating wavelength, where n1<n3<n2. The layer (M) is arranged at at least one transition from a layer (L) to a layer (H) and/or from a layer (H) to a layer (L). The dielectric layer system has a four-layer sequence of (LMHM)m or (HMLM)m, where m is equal to the number of four-layer sequences in the dielectric layer system.

19 Claims, 5 Drawing Sheets

(51) Int. Cl.
*G02B 21/16* (2006.01)
*G03F 7/20* (2006.01)
*G21K 1/06* (2006.01)

(58) Field of Classification Search
CPC .......... G02B 5/28; G02B 5/281; G02B 5/282; G02B 5/283; G03F 7/7015; G21K 1/062
USPC .................. 359/350, 359–361, 584–589
See application file for complete search history.

(56) References Cited

U.S. PATENT DOCUMENTS

| | | | | |
|---|---|---|---|---|
| 4,229,066 | A | * | 10/1980 | Rancourt ............ C03C 17/3417 |
| | | | | 359/359 |
| 4,320,936 | A | | 3/1982 | Sawamura |
| 5,310,603 | A | * | 5/1994 | Fukuda .................. B32B 15/08 |
| | | | | 359/584 |
| 5,400,179 | A | | 3/1995 | Ito |
| 5,850,309 | A | | 12/1998 | Shirai |
| 5,993,898 | A | | 11/1999 | Nagatsuka |
| 2004/0190281 | A1 | * | 9/2004 | Williams ............ A61F 9/00804 |
| | | | | 362/100 |
| 2006/0262389 | A1 | | 11/2006 | Zaczek |
| 2008/0158702 | A1 | | 7/2008 | Nose et al. |
| 2008/0247044 | A1 | * | 10/2008 | Kuwabara ............ G02B 5/0891 |
| | | | | 359/580 |
| 2011/0134515 | A1 | * | 6/2011 | Banerjee ................ G02B 5/283 |
| | | | | 359/359 |
| 2011/0206859 | A1 | | 8/2011 | Wang et al. | |
| 2012/0224160 | A1 | * | 9/2012 | Dodoc ............... G02B 17/0657 |
| | | | | 355/66 |

FOREIGN PATENT DOCUMENTS

| | | |
|---|---|---|
| JP | 2003318094 A | 11/2003 |
| JP | 2004260080 A | 9/2004 |
| JP | 2006-227099 * | 8/2006 |
| JP | 2008242332 A | 10/2008 |
| WO | 2015039705 A1 | 3/2015 |

OTHER PUBLICATIONS

Korean Office Action with English Translation, KR Patent Application No. 10-2018-7011394, dated Feb. 11, 2019, 9 pages.
Japanese Office Action with English Translation, JP Patent Application No. 2018-514390, dated Jan. 9, 2019, 6 pages.
International Preliminary Report on Patentability and Written Opinion in counterpart International Application No. PCT/EP2016/072246, dated Apr. 3, 2018, 7 pages.
International Search Report in counterpart International Application No. PCT/EP2016/072246, dated May 1, 2017, 6 pages.
Office Action in corresponding German Application 102015218763.2, dated Apr. 26, 2016, along with English Translation.
Korean Office Action with English translation in KR Application No. 10-2018-7011394, dated Aug. 30, 2019, 8 pages.

* cited by examiner

REFLECTIVE OPTICAL ELEMENT

CROSS REFERENCE TO RELATED APPLICATIONS

This is a Continuation of International Application PCT/EP2016/072246, which has an international filing date of Sep. 20, 2016, and which claims the priority of the German Patent Application No. 102015218763.2, filed Sep. 29, 2015. The disclosures of both applications are incorporated in their respective entireties into the present application by reference.

FIELD OF THE INVENTION

The present invention relates to a reflective optical element, in particular for an operating wavelength in the DUV or VUV wavelength range, comprising a substrate, a dielectric layer system and a metallic coating between the substrate and the dielectric layer system, wherein the dielectric layer system comprises at least respectively one layer composed of a material having a lower refractive index n1 at the operating wavelength, one layer composed of a material having a higher refractive index n2 at the operating wavelength and one layer composed of a material having a refractive index n3 at the operating wavelength, where n1<n3<n2, wherein a layer having a medium refractive index n3 is arranged at at least one transition from a layer having a lower refractive index n1 to a layer having a higher refractive index n2 and/or from a layer having a higher refractive index n2 to a layer having a lower refractive index n1. Furthermore, the invention relates to an optical system, a lithography device and a microscopy device comprising such a reflective optical element.

BACKGROUND

Inter alia, in microlithography using deep ultraviolet radiation (DUV radiation), or vacuum ultraviolet radiation (VUV radiation), in particular at wavelengths of between 150 nm and 300 nm, in optical systems dielectric mirrors are also used besides lens elements. In this case, an excimer laser that emits in said wavelength range often serves as a radiation source. Inter alia, excimer lasers that emit at 193 nm or at 248 nm are particularly widespread. U.S. Pat. No. 5,850,309 discloses a reflective optical element comprising a substrate, a dielectric layer system and a metallic coating between the substrate and the dielectric layer system. The metallic coating serves primarily for broadband reflection. The dielectric layer system serves to improve the properties of the reflective optical element. These include for example the reflectivity at the operating wavelength, the degree of polarization of the reflective radiation or else the resistance of the metallic coating to the DUV radiation and other environmental influences. The dielectric layer system described in U.S. Pat. No. 5,850,309 is constructed alternately from high and low refractive index materials. It can be divided into sub blocks, wherein different materials are used as low and respectively high refractive index layers in different sub blocks. As a result, in comparison with reflective optical elements comprising a metallic layer and without a dielectric layer system, increased reflectivities at the operating wavelength, i.e. the wavelength of the radiation source for which the respective reflective optical element is optimized, are achieved in conjunction with increased laser resistance.

US 2011/0206859 A1 discloses a reflective optical element of the generic type in which an amorphous layer composed of silicon dioxide or doped silicon dioxide is provided between at least two periods of fluoridic high and low reflective index layers.

SUMMARY

It is one object of the present invention to develop the known reflective optical element further.

This object is achieved, according to one formulation, with a reflective optical element, in particular for an operating wavelength in the DUV or VUV wavelength range, comprising a substrate, a dielectric layer system and a metallic coating between the substrate and the dielectric layer system, wherein the dielectric layer system comprises a layer composed of a material having a lower refractive index n1 at the operating wavelength, a layer composed of a material having a higher refractive index n2 at the operating wavelength and a layer composed of a material having a refractive index n3 at the operating wavelength, where n1<n3<n2, wherein a layer having the medium refractive index n3 is arranged at at least one transition from a layer having the lower refractive index n1 to a layer having the higher refractive index n2 and/or from a layer having the higher refractive index n2 to a layer having a lower refractive index n1, wherein the dielectric layer system comprises a four-layer sequence of (LMHM)m or (HMLM)m where L is the layer composed of a material having a lower refractive index n1 at the operating wavelength, H is the layer composed of a material having a higher refractive index n2 at the operating wavelength and M is the layer composed of a material having a refractive index n3 at the operating wavelength, and wherein n1<n3<n2, and m is the number of four-layer sequences in the dielectric layer system.

It has been found that providing at least one layer composed of a material having a medium refractive index n3 at the operating wavelength allows the total number of individual layers of the dielectric layer system to be reduced compared with the previously known reflective optical element in conjunction with comparable properties. As a result, it is possible not only to reduce the production costs but also to lengthen the lifetime of the reflective optical element, since the probability of stresses or delamination occurring is reduced, which increases the mechanical stability. Furthermore, a higher broadband characteristic can be obtained.

It should be pointed out that for the case where respectively more than one layer having a lower refractive index n1 and higher refractive index n2 is provided in the dielectric layer system, these layers are particularly preferably arranged alternately. Moreover, it should be pointed out that in the case of more than one layer composed of a material having a higher, lower or medium refractive index, these layers can be composed of respectively different materials, provided that the condition n1<n3<n2 is met for layers respectively arranged adjacently. In order to keep the production outlay lower, preferably only one material is ever used in each case.

In the case of the reflective optical element proposed, in particular the optical properties of the metallic coating can be positively influenced in a targeted manner. Moreover, it is also possible to increase the stability of said reflective optical element with respect to environmental influences and radiation damage in conjunction with a reduced number of layers.

Preferably, the layer of the dielectric layer system which is the furthest away from the substrate is a layer composed of a material having a medium refractive index n3, as a result of which the reflectivity of the reflective optical element at the operating wavelength can additionally be increased. Furthermore, as a result, the electric field of the standing wave that forms in the event of radiation reflection can be minimized, such that fewer secondary electrons that could adversely affect the lifetime of the reflective optical element are emitted.

Preferably, the dielectric layer system comprises at least two layers composed of a material having a medium refractive index n3. Just two layers composed of a material having the medium refractive index n3 make it possible to achieve a sufficient influencing of the optical and other properties, for example the broadband characteristic, of the reflective optical element in conjunction with a significantly reduced number of layers. Given three, four, five or more layers composed of a material having a medium refractive index n3, it is possible to achieve a greater influencing of the optical and other properties of the reflective optical element in conjunction with a number of layers reduced to a somewhat lesser extent.

Advantageously, the layer of the dielectric layer system which is second closest to the substrate is composed of a material having a medium refractive index n3, in particular if the dielectric layer system comprises at least two layers composed of a material having a medium refractive index n3, and/or the layer of the dielectric layer system which is the furthest away from the substrate is a layer composed of the material having a medium refractive index n3. The radiation resistance of the metallic coating and also the reflectivity can be increased as a result.

Preferably, the substrate is composed of quartz, titanium-doped quartz glass, calcium fluoride or glass ceramic.

Advantageously, the metallic coating comprises aluminum, an aluminum-silicon alloy, an aluminum-manganese alloy, an aluminum-silicon-manganese alloy, rhodium or a combination thereof. Such metallic layers can lead to a particularly broadband reflection or to a high reflection despite a broadband characteristic.

Preferably, in the case of reflective optical elements for an operating wavelength in the range of between 240 nm and 300 nm the layer composed of a material having a lower refractive index n1 is composed of one or more materials of the group aluminum fluoride, cryolite, chiolite, lithium fluoride and magnesium fluoride, the layer composed of a material having a higher refractive index n2 is composed of one or more materials of the group yttrium oxide, hafnium oxide, scandium oxide, zirconium oxide, aluminum nitride and synthetic diamond, and the layer composed of a material having a medium refractive index n3 is composed of one or more materials of the group barium fluoride, gadolinium fluoride, lanthanum fluoride, neodymium fluoride, dysprosium fluoride, aluminum oxide, yttrium fluoride, ytterbium fluoride and silicon dioxide.

In the case of reflective optical elements for an operating wavelength in the range of 150 nm to 240 nm, the layer composed of a material having a lower refractive index n1 is composed of one or more materials of the group aluminum fluoride, cryolite, chiolite, lithium fluoride and magnesium fluoride, the layer composed of a material having a higher refractive index n2 is composed of one or more materials of the group neodymium fluoride, gadolinium fluoride, dysprosium fluoride, lanthanum fluoride and aluminum oxide, and the layer composed of a material having the medium refractive index n3 is composed of one or more materials of the group magnesium fluoride, yttrium fluoride and silicon dioxide.

The layer materials for the dielectric layer system are selected with regard, in particular, to increasing the reflectivity of the reflective optical element in such a way that the medium refractive index n3 differs from the higher refractive index n1 and from the lower refractive index n2 by at least 2%.

In a further aspect, the object is achieved with an optical system for a lithography device or a microscopy device, and with a lithography device or a microscopy device for an operating wavelength in the DUV or VUV wavelength range comprising a reflective optical element as described. The microscopy devices can be wafer or mask inspection systems, for example.

BRIEF DESCRIPTION OF THE DRAWINGS

The present invention will be explained in greater detail with reference to exemplary embodiments. In this respect, in the Figures.

DETAILED DESCRIPTION

Figure 1:
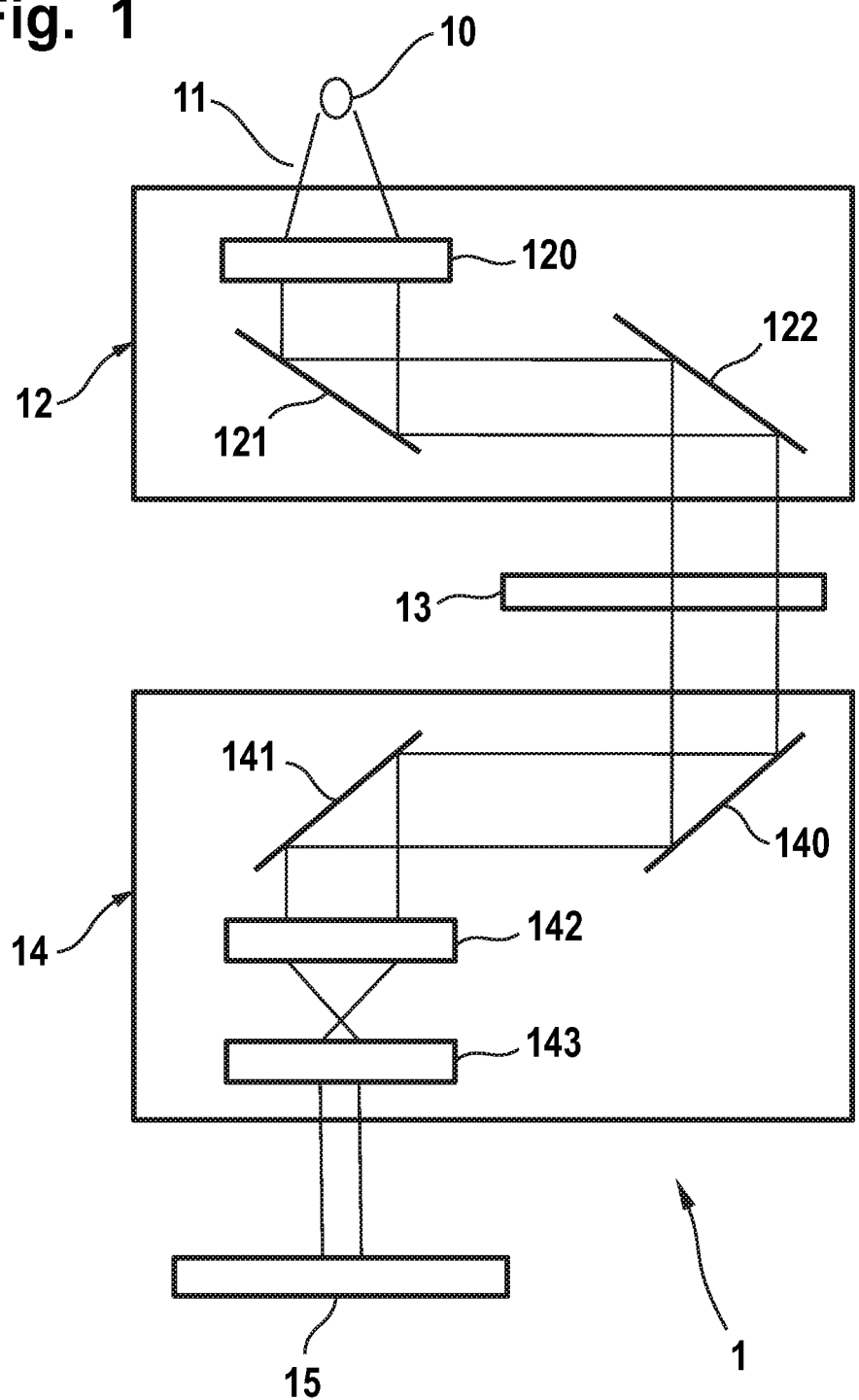
FIG. 1 shows a schematic basic diagram of a lithography device for the DUV or VUV wavelength range.

FIG. 1 shows a schematic basic diagram of a lithography device 1 for the DUV or VUV wavelength range. The lithography device 1 comprises, as essential components, in particular two optical systems 12, 14, an illumination system 12 and a projection system 14, which are both embodied as a catadioptric system in the present example. Carrying out the lithography necessitates a radiation source 10, particularly preferably an excimer laser, which emits for example at 308 nm, 248 nm, 193 nm or 157 nm and which can be an integral part of the lithography device 1. The radiation 11 emitted by the radiation source 10 is conditioned with the aid of the illumination system 12 such that a mask 13, also called reticle, can be illuminated therewith. To that end, the projection system 12 comprises at least one transmissive optical element and one reflective optical element. The lens element 120, which for example focuses the radiation 11, and the two mirrors 121, 122 are illustrated here in representative fashion. In a known manner, in the illumination system 12, a wide variety of transmissive, reflective and other optical elements can be combined with one another in an arbitrary, even more complex, manner.

The mask 13 has a structure on its surface, said structure being transferred to an element 15 to be exposed, for example a wafer in the context of the production of semiconductor components, with the aid of the projection system 14. In modifications, the mask 13 can also be embodied as a reflective optical element.

The projection system 14 also comprises at least one transmissive optical element and one reflective optical element. In the example illustrated here, two mirrors 140, 141 and two transmissive optical elements 142, 143 are illustrated in representative fashion, which serve for example in particular to reduce the structures on the mask 13 to the size desired for the exposure of the wafer 15. As in the case of the exposure system 12, in the case of the projection system 14 a wide variety of optical elements can be combined arbitrarily with one another in a known manner.

Figure 2:
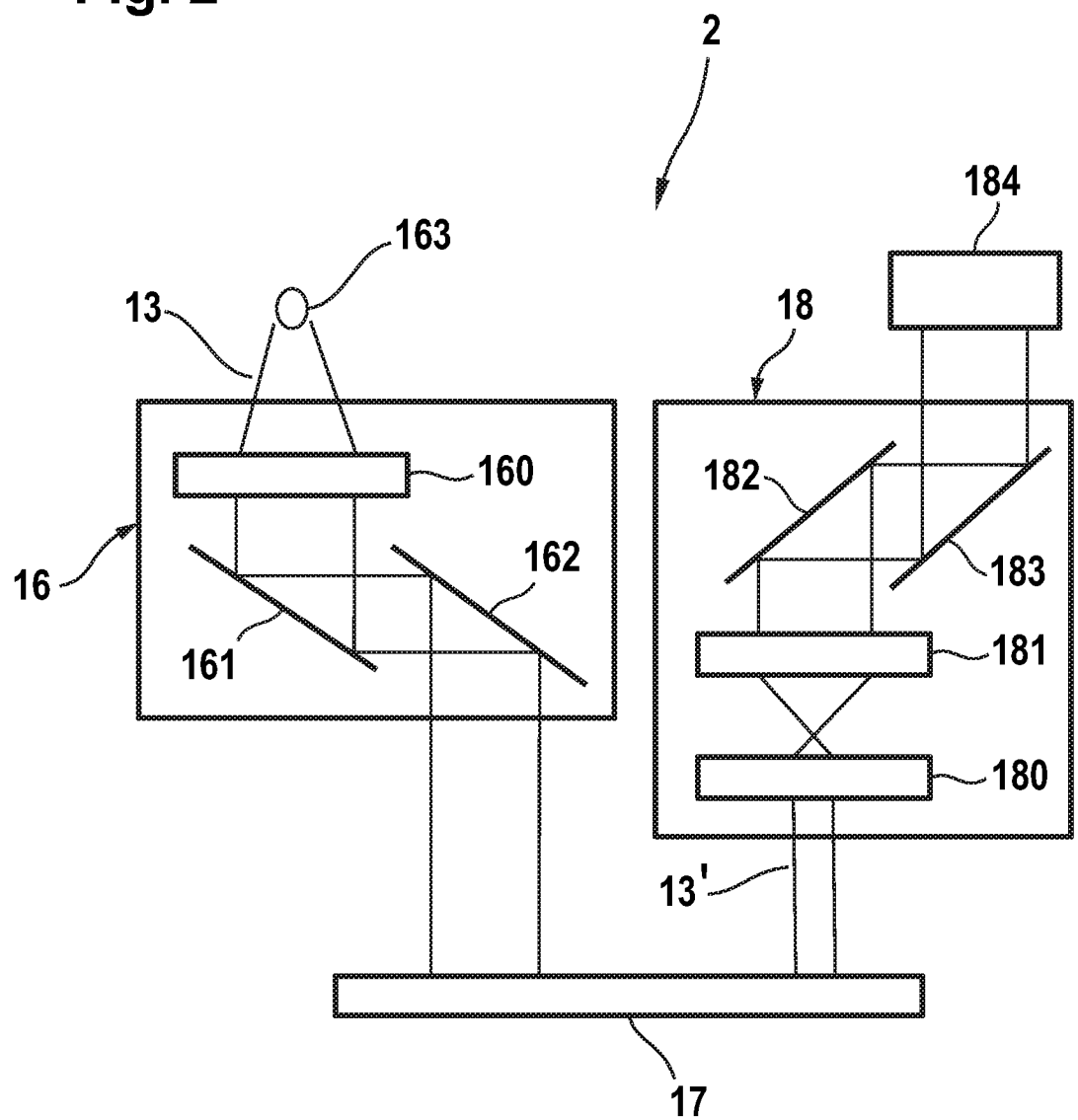
FIG. 2 shows a schematic basic diagram of a microscopy device for the DUV or VUV wavelength range.

FIG. 2 schematically shows the construction of a microscopy device 2 for the DUV or VUV wavelength range. In the present example, said microscopy device is embodied as a wafer inspection system and comprises an illumination system 16 and an imaging system 18, which are illustrated alongside one another for the sake of better clarity in the present example and are both embodied as a catadioptric system.

Carrying out the wafer inspection necessitates a radiation source 163, particularly preferably an excimer laser, which emits for example at 308 nm, 248 nm, 193 nm or 157 nm and which can be an integral part of the microscopy device 2. The radiation 13 emitted by the radiation source 10 is conditioned with the aid of the illumination system 16 such that a wafer 17 can be illuminated therewith. To that end, the projection system 12 comprises at least one transmissive optical element and one reflective optical element. The lens element 160, which for example focuses the radiation 13, and the two mirrors 161, 162 are illustrated here in representative fashion. In a known manner, in the illumination system 16, a wide variety of transmissive, reflective and other optical elements can be combined with one another in an arbitrary, even more complex, manner.

The radiation 13' (shown displaced in a parallel fashion in FIG. 2) reflected at the surface of the wafer to be examined is guided through the imaging system 18 onto the detector 184 in such a way that structures on the surface of the wafer 17 are represented in an enlarged manner upon infringement on the detector, for example a spatially resolving surface detector, for instance on the basis of a CCD (charge-coupled device) sensor.

The imaging system 18 also comprises at least one transmissive optical element and one reflective optical element. In the example illustrated here, two transmissive optical elements 180, 181, which serve for example in particular to magnify the structures on the wafer 17, and two mirrors 182, 183 are illustrated in representative fashion. As in the case of the illumination system 16, in the case of the imaging system 18 a wide variety of optical elements can be combined arbitrarily with one another in a known manner.

Both the mirrors 121, 122, 140, 141 and the mask 13 from FIG. 1 and also the mirrors 161, 162, 182, 183 from FIG. 2 can be a reflective optical element, in particular for an operating wavelength in the range of 150 nm to 300 nm, comprising a substrate, a dielectric layer system and a metallic coating between the substrate and the dielectric layer system, wherein the dielectric layer system comprises a layer composed of a material having a lower refractive index $n1$ at the operating wavelength, a layer composed of a material having a higher refractive index $n2$ at the operating wavelength and a layer composed of a material having a refractive index $n3$ at the operating wavelength, where $n1<n3<n2$, wherein layers having a lower refractive index $n1$ and layers having a higher refractive index $n2$ are arranged alternately if more than respectively one thereof is provided, and a layer having a medium refractive index $n3$ is arranged at at least one transition from a layer having a lower refractive index $n1$ to a layer having a higher refractive index $n2$ and/or from a layer having a higher refractive index $n2$ to a layer having a lower refractive index $n1$.

Figure 3:
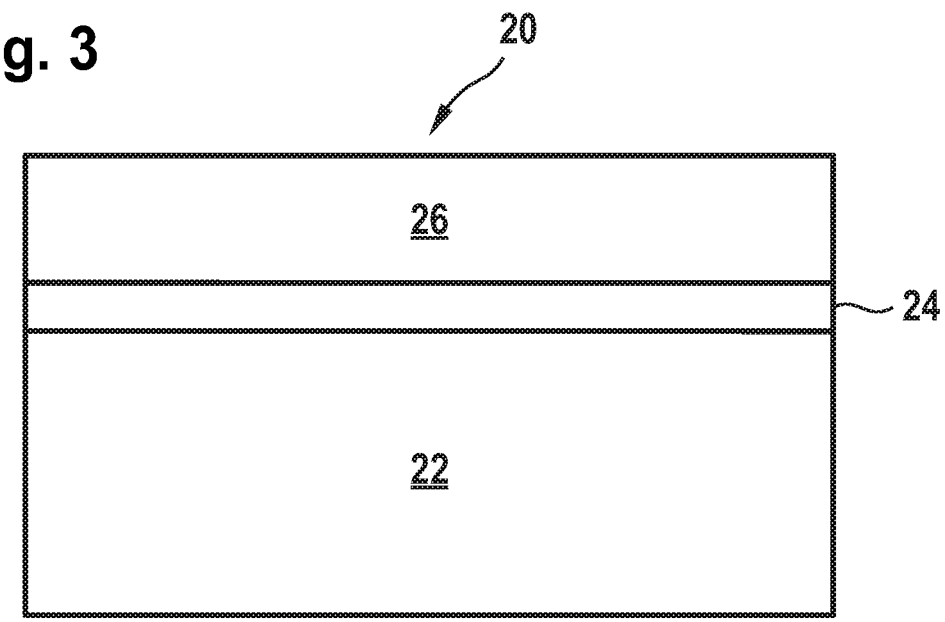
FIG. 3 schematically shows the structure of a reflective optical element which is suitable for use in lithography using DUV or VUV radiation.

FIG. 3 schematically illustrates the construction of a reflective optical element 20 which is suitable for use in lithography using DUV or VUV radiation. A metallic coating 24 is arranged on a substrate 22. The substrate 22 can be composed of quartz, titanium-doped quartz glass, calcium fluoride or glass ceramic, for example. The metallic coating 24 comprises for example aluminum, an aluminum-silicon alloy, an aluminum-manganese alloy, an aluminum-silicon-manganese alloy, rhodium or a combination thereof, and serves primarily as a broadband mirror. In order firstly to protect the metallic coating 24 and secondly to influence the properties of the radiation reflected at the reflective optical element 20, a dielectric layer system 26 is provided on that side of the metallic coating 24 which faces away from the substrate 22, as a seal with respect to the vacuum.

Figure 4:
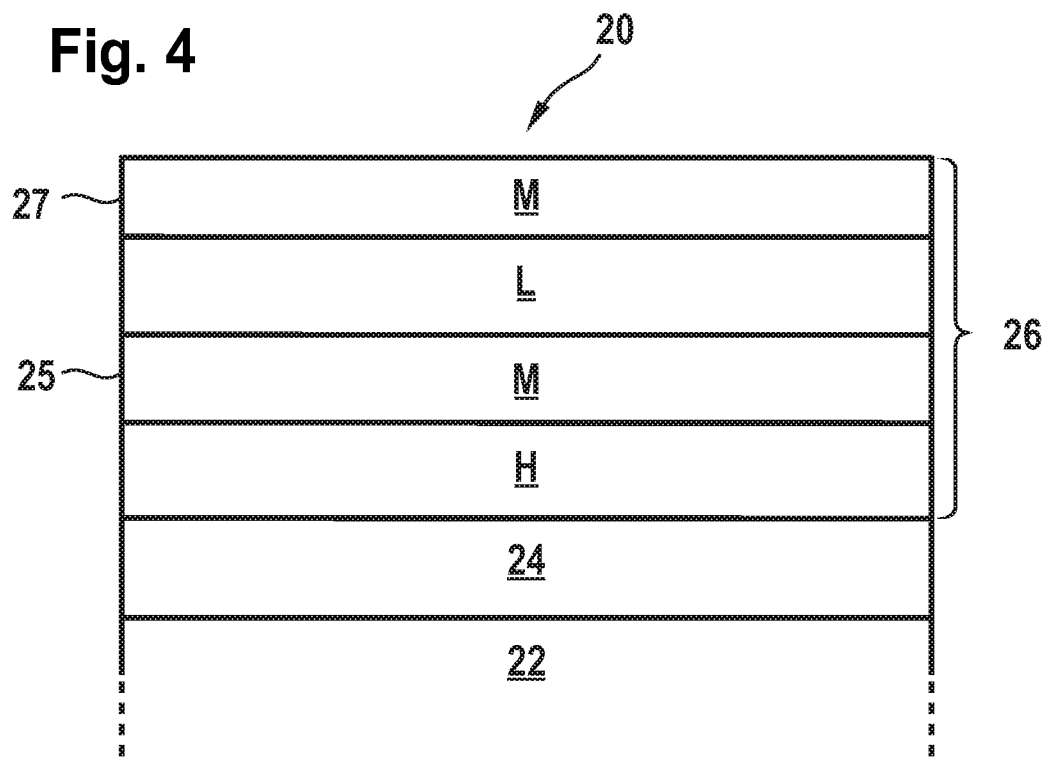
FIG. 4 schematically shows a first embodiment of the reflective optical element proposed.

In one exemplary embodiment, illustrated schematically in FIG. 4, the dielectric layer system 26 comprises a four-layer sequence of (HMLM)m where L is the layer composed of a material having a lower refractive index $n1$ at the operating wavelength, H is the layer composed of a material having a higher refractive index $n2$ at the operating wavelength and M is the layer composed of a material having a refractive index $n3$ at the operating wavelength, wherein $n1<n3<n2$, and m is the integer number of four-layer sequences in the dielectric layer system. In the example illustrated here, m=1. The number m can be chosen arbitrarily in particular depending on the desired properties of the reflective optical element.

Preferably, the layer 27 of the system 26 which is furthest away from the substrate 22 or the layer 25 of the system 26 which is second closest to the substrate 22 is a layer M having a medium refractive index $n3$. In the example illustrated in FIG. 4, both the second closest layer 25 and the layer 27 which is furthest away are composed of a material having a medium refractive index $n3$. The embodiment of a reflective optical element 20 proposed here, as illustrated by way of example in FIG. 4, thus comprises in its dielectric layer system two layers M having a medium refractive index $n3$ in addition to the known layers H and L having a higher and lower refractive index $n1$, $n2$, respectively.

Figure 5:
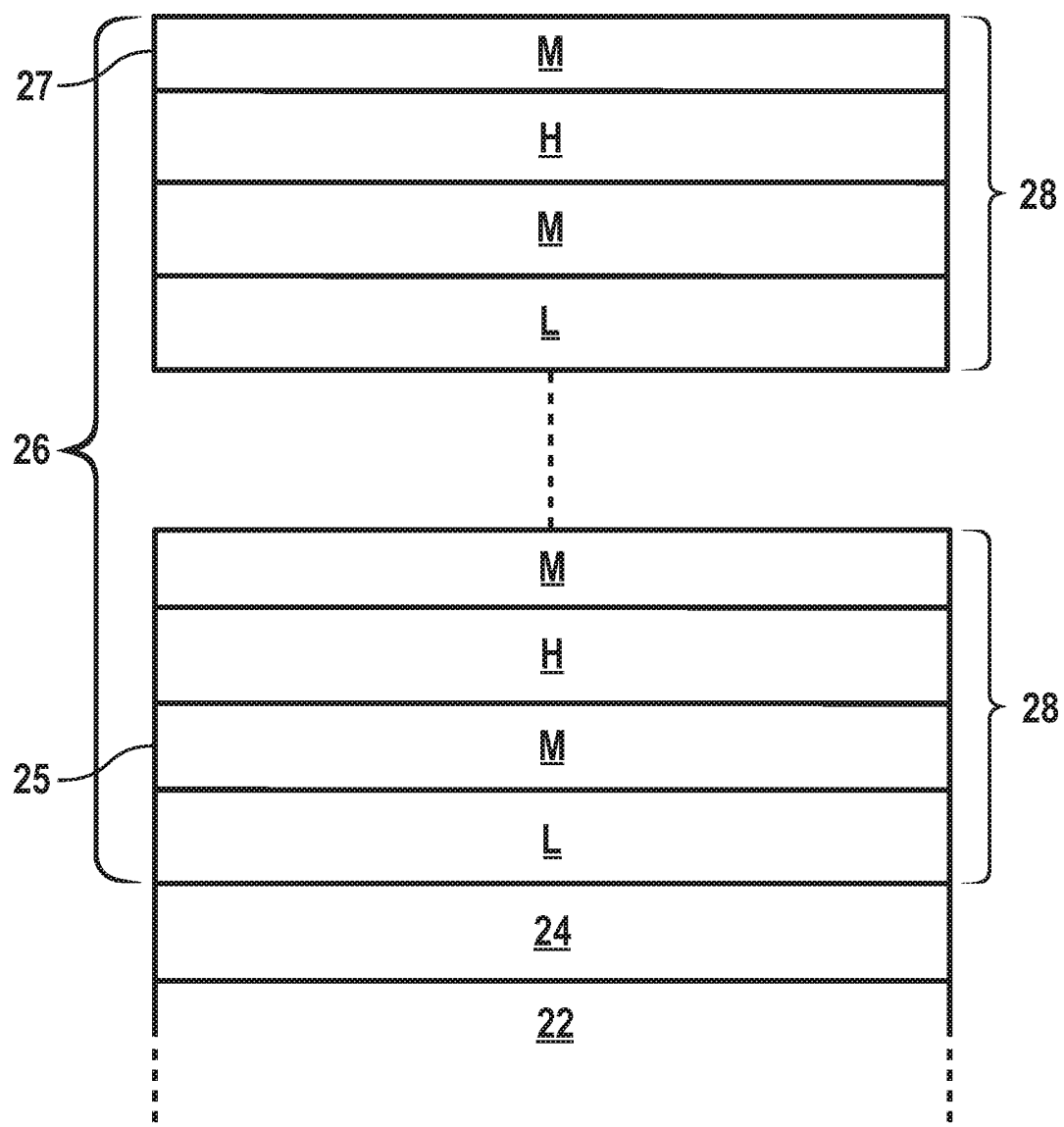
FIG. 5 schematically shows a second embodiment of the reflective optical element proposed.

In a variant that is illustrated schematically in FIG. 5, the dielectric layer system 26 can also comprise a plurality of four-layer sequences 28 of (LMHM)m. In the example illustrated in FIG. 5, too, the layer 27 of the system 26 which is furthest away from the substrate 22 and the layer 25 of the system 26 which is second closest to the substrate 22 are a layer M having a medium refractive index $n3$. The dielectric layer system 26 comprises 2*m layers M. In further variants, at least one of the four-layer sequences 28 mentioned in connection with FIG. 4 or FIG. 5 can be arranged directly on the metallic coating 24 and/or as a block of the dielectric layer system 26 which provides sealing with respect to the vacuum or is furthest away from the substrate 22, and the remaining layers of the dielectric layer system can preferably be alternately arranged H and L and/or L and H layers. One or a plurality of four-layer sequences 28 can also be arranged at other positions within the dielectric layer sequence. The materials for the L and H layers can be always respectively one material or else, as described in U.S. Pat. No. 5,850,309, different materials in blocks. The material for the M layers is selected depending on the materials of the H and L layers respectively arranged in an adjoining fashion, with the proviso that $n1<n3<n2$ holds true at the operating wavelength for which the reflective optical element is optimized.

Figure 6:
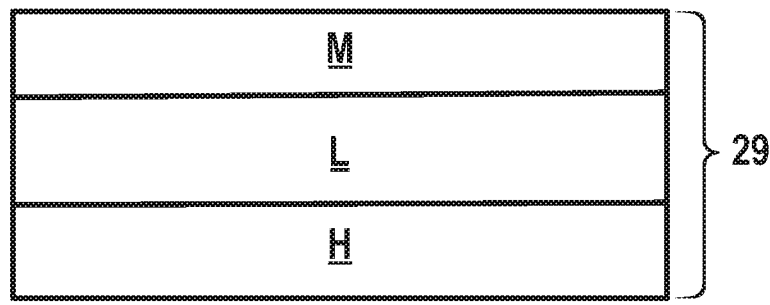
FIGS. 6 to 9 schematically show various layer sequences within the dielectric layer system of a further reflective optical element.
Figure 7:
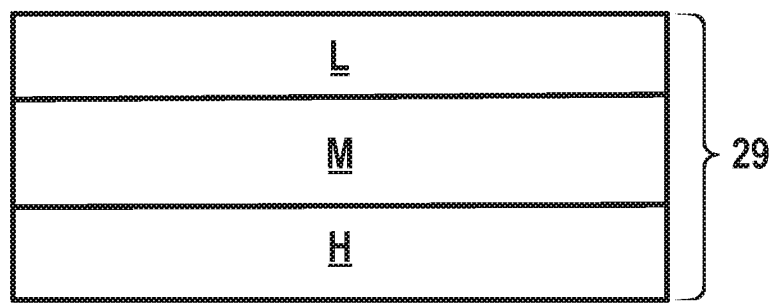
Figure 8:
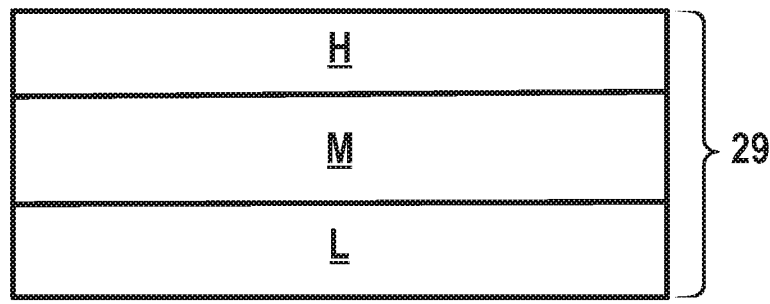
Figure 9:
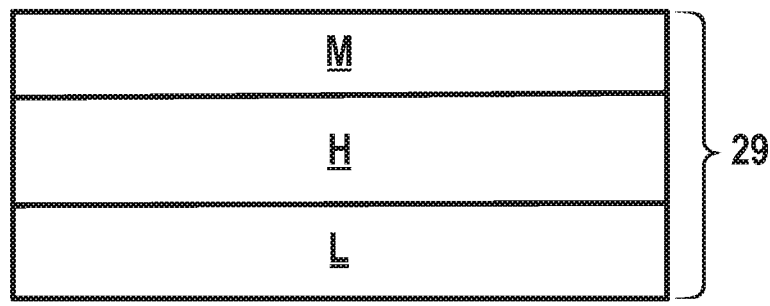

In embodiments of a further reflective optical element, for example for a microscope device or for an optical system for a microscope device, instead of the four-layer sequences 28, three-layer sequences (HLM)m, (HML)m, (LMH)m or (LHM)m where m is the number of three-layer sequences 29 can also be arranged in the dielectric layer system 26, wherein it is likewise the case that n1<n3<n2. Said three-layer sequences are illustrated schematically in FIGS. 6 to 9. Moreover, both three-layer sequences 29 and four-layer sequences can be provided in a dielectric layer system 26. For the arrangement directly adjoining the metallic coating 24 on the side thereof facing away from the substrate 22, the three-layer sequences 29 (HML)m and (LMH)m illustrated in FIGS. 7 and 8 are preferred. For the arrangement furthest away from the substrate 22 or from the metallic coating 24, the three-layer sequences 29 (HLM)m and (LHM)m illustrated in FIGS. 6 and 9 are preferred.

Preferably, in the case of reflective optical elements for an operating wavelength in the range of between 240 nm and 300 nm, the layer L, composed of a material having a lower refractive index n1 is composed of one or more materials of the group aluminum fluoride, cryolite, chiolite, lithium fluoride and magnesium fluoride, the layer H composed of a material having a higher refractive index n2 is composed of one or more materials of the group yttrium oxide, hafnium oxide, scandium oxide, zirconium oxide, aluminum nitride and synthetic diamond, and the layer M composed of a material having a medium refractive index n3 is composed of one or more materials of the group barium fluoride, gadolinium fluoride, lanthanum fluoride, neodymium fluoride, dysprosium fluoride, aluminum oxide, yttrium fluoride, ytterbium fluoride and silicon dioxide.

In the case of reflective optical elements for an operating wavelength in the range of 150 nm to 240 nm, the layer L composed of a material having a lower refractive index n1 is composed of one or more materials of the group aluminum fluoride, cryolite, chiolite, lithium fluoride and magnesium fluoride, the layer H composed of a material having a higher refractive index n2 is composed of one or more materials of the group neodymium fluoride, gadolinium fluoride, dysprosium fluoride, lanthanum fluoride and aluminum oxide, and the layer M composed of a material having the medium refractive index n3 is composed of one or more materials of the group magnesium fluoride, yttrium fluoride and silicon dioxide.

The layer materials for the dielectric layer system are selected with regard, in particular, to increasing the reflectivity of the reflective optical element in such a way that the medium refractive index n3 differs from the higher refractive index n1 and from the lower refractive index n2 by at least 2%.

A reflective optical element composed of a quartz substrate having a metallic coating composed of aluminum comprises a dielectric layer system having five four-layer sequences of the type LMHM, that is to say 20 individual layers. It is designed for use with an excimer laser that emits at 193 nm.

The reflectivity of this reflective optical element having a corresponding combination of high, medium and low refractive index materials previously mentioned as suitable for an operating wavelength in the range of 150 nm to 240 nm, given an angle of incidence of 10° with respect to the surface normal and unpolarized radiation, is above 95% for wavelengths of between 190 nm and 215 nm and then falls to values of between 95% and 90% to 250 nm. Between 250 nm and 300 nm, the reflectivity is still in the range of between approximately 88% and almost 90%. A reflective optical element having comparable reflectivity and comparable properties, but without medium refractive index layers, comprises a dielectric layer system having a significantly greater number of individual layers.

Furthermore, a further reflective optical element composed of a quartz substrate having a metallic coating composed of aluminum was investigated, said further reflective optical element comprising a dielectric layer system having a first three-layer sequence of the type HML, an intermediate block of the type HLH and, providing sealing with respect to the vacuum, a second three-layer sequence of the type LHM, that is to say having a total of 9 individual layers. It is designed for use with an excimer laser that emits at 193 nm.

The reflectivity of this further reflective optical element having a corresponding combination of high, medium and low refractive index materials previously mentioned as suitable for an operating wavelength in the range of 150 nm to 240 nm, given an angle of incidence of 20° with respect to the surface normal and unpolarized radiation, rises to a reflectivity of above 90% starting from a wavelength of approximately 186 nm and is above 95% for wavelengths of between approximately 196 nm and approximately 212 nm and then falls to values of between 95% and 90% up to approximately 275 nm. Up to 300 nm, the reflectivity decreases to approximately 82%. A reflective optical element having comparable reflectivity and comparable properties, but without medium refractive index layers, comprises a dielectric layer system having a significantly greater number of individual layers.

A reflective optical element which is constructed in substantially just the same way, but in whose dielectric layer system the two layers composed of the medium refractive index material are omitted for comparison purposes, given likewise unpolarized radiation and given an angle of incidence of 20° with respect to the surface normal, has a significantly lower broadband characteristic and lower maximum reflectivity: The reflectivity rises to a reflectivity of above 90% starting from a wavelength of approximately 184 nm, and attains a maximum of approximately 94.8% at approximately 202 nm and falls below 90% again to give at approximately 230 nm. At approximately 244 nm, a local minimum of 87.2% is attained. In the wavelength range of approximately 268 nm to 300 nm, the reflectivity fluctuates in a range of approximately 90% to 91.2%.

In variants comprising, instead of aluminum, a metallic coating composed of an aluminum-silicon alloy, an aluminum-manganese alloy, an aluminum-silicon-manganese alloy, rhodium or a combination thereof or with aluminum, comparable results were obtained. This also applies to variants which were optimized for excimer lasers that emit at other wavelengths, inter alia with materials suitable for an operating wavelength of between 240 nm and 300 nm.

It should be pointed out that the reflective optical elements proposed here can have a reflectivity of above 90% even given a fixed wavelength of the incident radiation, but over an extended angle-of-incidence range of multiple 10°.

What is claimed is:
1. A reflective optical element, comprising:
a substrate;
a dielectric layer system; and
a metallic coating between the substrate and the dielectric layer system,
wherein the dielectric layer system is configured to reflect radiation at an operating wavelength greater than or equal to 150 nm and comprises at least one four-layer sequence of layers, the at least one four-layer sequence of layers comprising:

a layer composed of material having a lower refractive index n1 at the operating wavelength, a layer composed of material having a higher refractive index n2 at the operating wavelength, a first layer composed of material having a medium refractive index n3 at the operating wavelength, where n1<n3<n2, and a second layer composed of the material having the medium refractive index n3, wherein the four-layer sequence is (LM1HM2)m or (HM1LM2)m, where L designates the layer composed of material having the lower refractive index n1 at the operating wavelength, H designates the layer composed of material having the higher refractive index n2 at the operating wavelength, M1 designates the first layer composed of material having a refractive index n3 at the operating wavelength, and M2 designates the second layer composed of material having a refractive index n3 at the operating wavelength, and where m designates a number of the four-layer sequences in the dielectric layer system, and wherein the layer (L) composed of material having the lower refractive index n1 is composed of at least one of: aluminum fluoride, cryolite, chiolite, lithium fluoride and magnesium fluoride, the layer (H) composed of material having the higher refractive index n2 is composed of at least one of: neodymium fluoride, gadolinium fluoride, dysprosium fluoride, lanthanum fluoride and aluminum oxide, and the layers (M1, M2) composed of material having the medium refractive index n3 are composed of at least one of: magnesium fluoride, yttrium fluoride and silicon dioxide.

2. The reflective optical element as claimed in claim 1, wherein the layer of the dielectric layer system which is furthest away from the substrate is a layer composed of material having the medium refractive index n3.

3. The reflective optical element as claimed in claim 1, wherein the layer of the dielectric layer system which is second closest to the substrate is composed of material having the medium refractive index n3.

4. The reflective optical element as claimed in claim 1, wherein the metallic coating comprises at least one of: aluminum, an aluminum-silicon alloy, an aluminum-manganese alloy, an aluminum-silicon-manganese alloy, and rhodium.

5. An optical system for a lithography device or a microscopy device comprising a reflective optical element as claimed in claim 1.

6. The reflective optical element as claimed in claim 1, configured for an operating wavelength in a deep ultraviolet (DUV) or vacuum ultraviolet (VUV) wavelength range.

7. A lithography device for an operating wavelength in a DUV or VUV wavelength range comprising a reflective optical element as claimed in claim 1.

8. A microscope device for an operating wavelength in a DUV or VUV wavelength range comprising a reflective optical element as claimed in claim 1.

9. A reflective optical element, comprising:
a substrate;
a dielectric layer system configured to reflect radiation at an operating wavelength between 240 nm and 300 nm; and
a metallic coating between the substrate and the dielectric layer system,
wherein the dielectric layer system comprises at least one four-layer sequence of layers, the at least one four-layer sequence of layers comprising:
a layer composed of material having a lower refractive index n1 at the operating wavelength, a layer composed of material having a higher refractive index n2 at the operating wavelength, a first layer composed of material having a medium refractive index n3 at the operating wavelength, where n1<n3<n2, and a second layer composed of the material having the medium refractive index n3, wherein the four-layer sequence is (LM1HM2)m or (HM1LM2)m, where L designates the layer composed of material having the lower refractive index n1 at the operating wavelength, H designates the layer composed of material having the higher refractive index n2 at the operating wavelength, M1 designates the first layer composed of material having a refractive index n3 at the operating wavelength, and M2 designates the second layer composed of material having a refractive index n3 at the operating wavelength, and where m designates a number of the four-layer sequences in the dielectric layer system, and wherein the layer (L) composed of material having the lower refractive index n1 is composed of at least one of: aluminum fluoride, cryolite, chiolite, lithium fluoride and magnesium fluoride, the layer (H) composed of material having the higher refractive index n2 is composed of at least one of: yttrium oxide, hafnium oxide, scandium oxide, zirconium oxide, aluminum nitride and synthetic diamond, and the layers (M1, M2) composed of material having the medium refractive index n3 is composed of at least one of: barium fluoride, gadolinium fluoride, lanthanum fluoride, neodymium fluoride, dysprosium fluoride, aluminum oxide, yttrium fluoride, ytterbium fluoride and silicon dioxide.

10. The reflective optical element as claimed in claim 9, wherein the layer of the dielectric layer system which is furthest away from the substrate is a layer composed of material having the medium refractive index n3.

11. The reflective optical element as claimed in claim 9, wherein the layer of the dielectric layer system which is second closest to the substrate is composed of material having the medium refractive index n3.

12. The reflective optical element as claimed in claim 9, wherein the metallic coating comprises at least one of: aluminum, an aluminum-silicon alloy, an aluminum-manganese alloy, an aluminum-silicon-manganese alloy, and rhodium.

13. A lithography device for operating within the 240 nm to 300 nm wavelength range comprising a reflective optical element as claimed in claim 9.

14. A microscope device for operating within the 240 nm to 300 nm wavelength range comprising a reflective optical element as claimed in claim 9.

15. A reflective optical element
a substrate;
a dielectric layer system configured to reflect radiation an operating wavelength between 150 nm and 240 nm; and
a metallic coating between the substrate and the dielectric layer system,
wherein the dielectric layer system comprises at least one four-layer sequence of layers, the at least one four-layer sequence of layers comprising:
a layer composed of material having a lower refractive index n1 at the operating wavelength,
a layer composed of material having a higher refractive index n2 at the operating wavelength, and a first layer composed of material having a medium refractive index n3 at the operating wavelength, where n1<n3<n2, and a second layer composed of the material having the medium refractive index n3, wherein the four-layer sequence is (LM1HM2)m or (HM1LM2)m, where L designates the layer composed of material having the lower refractive index n1 at the operating wavelength, H designates the layer composed of material having the higher refractive index n2 at the operating wavelength, M1 designates the first layer composed of material having a refractive index n3 at the operating wavelength, M2 designates the second layer composed of material having a refractive index n3 at the operating wavelength, and where m designates a number of the four-layer sequences in the dielectric layer system, and wherein the layer (L) composed of material having the lower refractive index n1 is composed of at least one of: aluminum fluoride, cryolite, chiolite, lithium fluoride and magnesium fluoride, the layer (H) composed of material having the higher refractive index n2 is composed of at least one of: neodymium fluoride, gadolinium fluoride, dysprosium fluoride, lanthanum fluoride and aluminum oxide, and the layers (M1, M2) composed of material having the medium refractive index n3 are composed of at least one of: magnesium fluoride, yttrium fluoride and silicon dioxide.

16. The reflective optical element as claimed in claim 15, wherein the layer of the dielectric layer system which is second closest to the substrate is composed of material having the medium refractive index n3.

17. The reflective optical element as claimed in claim 15, wherein the metallic coating comprises at least one of: aluminum, an aluminum-silicon alloy, an aluminum-manganese alloy, an aluminum-silicon-manganese alloy, and rhodium.

18. A lithography device for operating within the 150 nm and 240 nm wavelength range comprising a reflective optical element as claimed in claim 15.

19. A microscope device for operating within the 150 nm and 240 nm wavelength range comprising a reflective optical element as claimed in claim 15.

* * * * *

UNITED STATES PATENT AND TRADEMARK OFFICE
CERTIFICATE OF CORRECTION

PATENT NO. : 11,099,308 B2
APPLICATION NO. : 15/940006
DATED : August 24, 2021
INVENTOR(S) : Weigl et al.

Page 1 of 1

It is certified that error appears in the above-identified patent and that said Letters Patent is hereby corrected as shown below:

In the Claims

Column 10, Line 54, in Claim 15, delete "optical element" and insert --optical element, comprising:-- therefor.

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*